United States Patent [19]

West

[11] 3,833,837

[45] Sept. 3, 1974

[54] MODULAR COOLING ENCLOSURE WITH EXPANDABLE COOLING CELLS

[76] Inventor: Barry R. West, 2921 Croydon, Denton, Tex. 76201

[22] Filed: July 20, 1973

[21] Appl. No.: 380,966

[52] U.S. Cl. ............ 317/100, 174/15 R, 317/234 A

[51] Int. Cl. .............................................. H01l 1/12

[58] Field of Search ............ 317/234 A, 100, 101 D, 317/101 DH; 211/128; 165/47, 182; 174/15 R, 16 R, DIG. 5

[56] References Cited

UNITED STATES PATENTS

| | | | |
|---|---|---|---|
| 3,602,774 | 8/1971 | Grant | 317/100 |
| 3,633,075 | 1/1972 | Hawkins | 317/120 |
| 3,646,400 | 2/1972 | Demarest | 174/15 R |
| 3,697,815 | 10/1972 | Grant | 317/100 |
| 3,749,981 | 7/1973 | Koltuniak | 317/100 |

OTHER PUBLICATIONS

IBM Tech. Discl. Bulletin, Vol. 14 No. 5 Oct. 1971, pp. 1489, 1490, "Transistor Heat Sink."

*Primary Examiner*—Robert K. Schaffer
*Assistant Examiner*—Gerald P. Tolin
*Attorney, Agent, or Firm*—Jack A. Kanz

[57] ABSTRACT

Disclosed is a forced convection cooling apparatus for mounting and cooling electronic components. Modules carrying closely spaced fins are adapted for mounting within an enclosure in a repetitive gridwork pattern leaving the electronic devices exposed on the downstream end of the enclosure.

7 Claims, 2 Drawing Figures

MODULAR COOLING ENCLOSURE WITH EXPANDABLE COOLING CELLS

Figure 1:
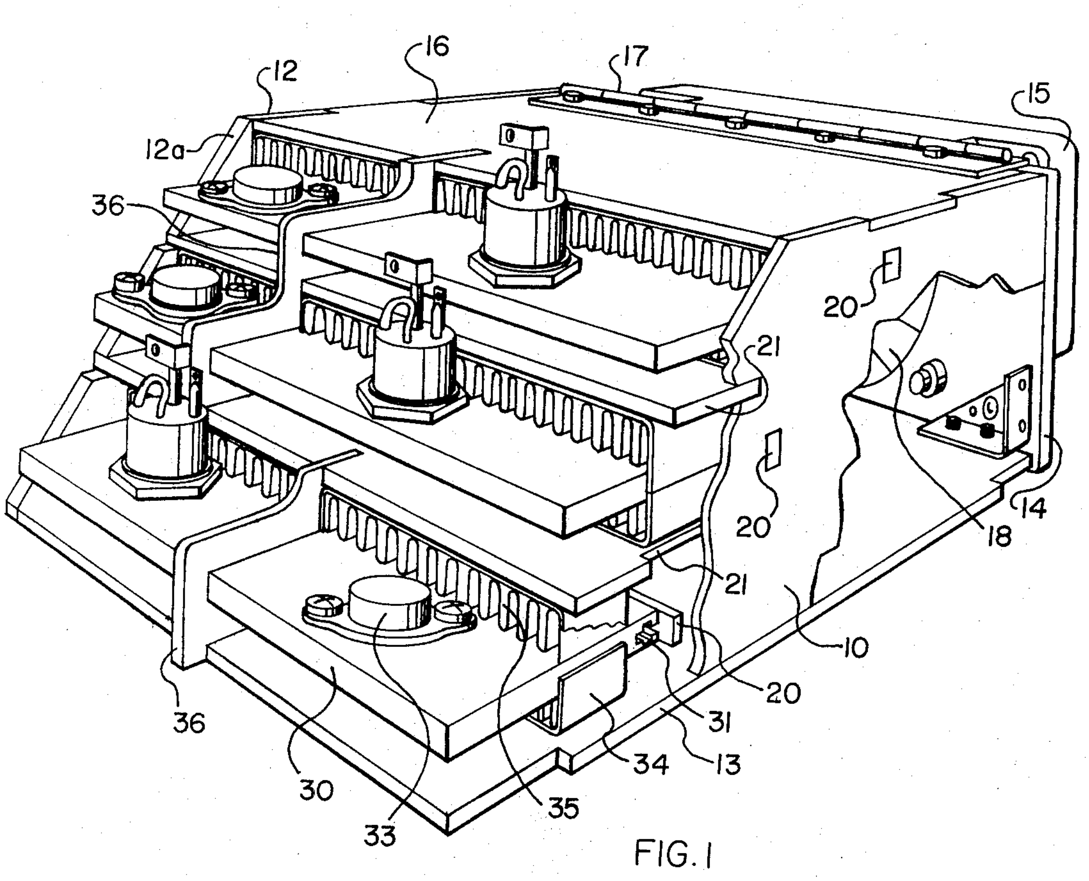

This invention relates to packaging and cooling apparatus for electronic devices and electronic circuitry components. More particularly it relates to a modular support and cooling package including a forced air enclosure incorporating a repeating gridwork of support beams adapted to support a plurality of individual modular cooling and mounting blocks arranged to optimize cooling by air forced through the grid yet allow ready access to each component for easy removal, replacement and interconnection.

Many semi-conductor devices generate heat during operation. The heat must be dissipated to avoid damage to the device. In some devices the heat generated is dissipated sufficiently by the enclosure, header or leads. Other devices may be mounted on heat sinks comprising plates of thermally conductive material such as copper, aluminum or the like which dissipate the heat generated by the device. Such heat sinks may typically be extruded metal bodies including heat dissipating fins.

For very high powered devices which generate extremely high power, as well as for extremely temperature sensitive components, liquid cooled mounting surfaces are often used. Normally, however, natural air convection is relied on to dissipate heat from the cooling surfaces. In high density applications of such devices forced air may be used to dissipate heat from the cooling surfaces.

For mechanical reasons extruded aluminum fins cannot be produced with sufficient fin density to take full advantage of the potential cooling of forced convection. Accordingly, some cooling devices utilizing forced convection generally use thin, closely spaced metal sheets affixed to the cooling surface by brazing, welding or the like. In some cases a corrugated stock is brazed onto surfaces of aluminum plates to provide sufficient density of cooling fins to take full advantage of the cooling potential of forced convection.

All of the above methods of cooling electronic components include certain disadvantages, particularly where the electronic components are to be electrically interconnected in a closely spaced relationship yet remain easily accessible for interconnection, replacement and exchange.

In accordance with the present invention the disadvantages of the prior art are overcome by arranging a plurality of finned mounting plates or blocks in an enclosure containing a grid of mounting bars producing a repeating gridwork pattern. The mounting blocks are substantially identical and thus interchangeable. The cooling enclosure is adapted to contain a plurality of such modules in a gridwork pattern whereby modules may be removed or rearranged without interfering with air flow. Furthermore, by arranging the modules in a gridwork pattern in a vertical plane or cascading along a generally sloping plane with the electronic device disposed toward the downstream end of the module, the devices can be easily electrically interconnected without removing them from the support and cooling module and without interfering with air flow through the enclosure.

Figure 2:
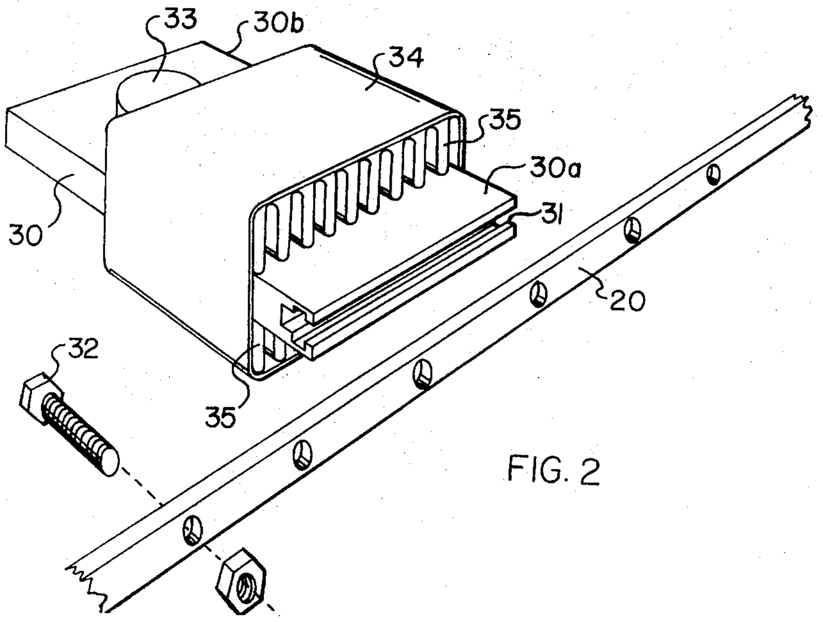

Other features and advantages of the invention will become more readily understood when taken in connection with the appended claims and attached drawing in which:

FIG. 1 is a perspective view, partially in section, of the preferred embodiment of cooling apparatus employing the principles of the invention; and FIG. 2 is a perspective view of the component cooling module illustrating its interrelationship with the supporting bars within the apparatus of FIG. 1.

As illustrated in FIG. 1 the preferred embodiment of the invention includes an enclosure having parallel sides 10 and 12 secured to an interconnecting bottom plate 13. The enclosure is enclosed on one end by an end plate 14 which is appropriately provided with means for mounting a fan housing 15. As illustrated in FIG. 1 the top plate 16 of the enclosure is shorter than the bottom plate of the enclosure. Accordingly, side plates 10 and 12 are trapezoidal in design.

The enclosure is provided with a top plate 16 which is preferably hinged at the enclosed end 14 by means of a hinge 17, thereby providing easy access to the interior of the enclosure. End plate 14 is provided with an opening 18 through which air may be drawn into the enclosure by means of a fan and motor mounted in fan housing 15 or appropriately disposed within the enclosure (not illustrated). Alternatively, air may be supplied through opening 18 by some external source. It will thus be observed that air drawn through opening 18 will be forced horizontally through the enclosure toward the open end opposite end plate 14.

A plurality of supporting or retaining beams 20 are horizontally disposed within the enclosure between sides 10 and 12. In the preferred embodiment the uppermost beam 20 is disposed nearest the end plate 14 and the lower beams disposed further toward the open end along a line paralleling the edges 10*a* and 12*a* of sides 10 and 12, respectively, so that the beams 20 are disposed along a plane sloping downwardly from the top 16 of the enclosure. Alternatively, the beams 20 may be disposed parallel in a single vertical plane.

Interspersed between beams 20 are horizontal divider plates 21. Divider plates 21 are substantially parallel to the bottom plate 13 and spaced approximately equidistant from the beams 20. The rear end of each divider plate 21 terminates at sloping edges 10*a* and 12*a* of the sides 10 and 12. The forward edge of each plate terminates approximately directly below the beam 20 immediately thereabove. It will therefore be observed that each beam 20 is spaced approximately equidistant between two horizontal dividers 21 which form a channel disposed horizontally through the enclosure.

The preferred form of the support and cooling module is illustrated in FIG. 2. The cooling module comprises a substantially rectangular plate 30 formed of thermally conductive material such as aluminum. A lipped groove 31 traverses one end surface of the plate 30 and is preferably adapted to conform to the head of a stud such as bolt 32 projecting horizontally from the beam 20. Accordingly, the plate 30 can be moved laterally with the head of the stud 32 sliding in the channel 31 to place the plate at any desired position along the beam.

In the preferred embodiment of the invention the groove 31 will be attached to the stud 32 on the downstream side of the beam 20. Accordingly, for reference purposes, the plate 30 will hereafter be described with reference to the forward end or upstream end 30*a* and the downstream end 30*b*.

In the preferred embodiment the semiconductor component is mounted in a conventional manner on one surface of the downstream end of the plate 30 as indicated at 33. A shroud 34 is provided between the semiconductor component 33 and the forward end 30a of the plate and projects upwardly and downwardly from the opposed surfaces of the plate 30. The shroud 34 cooperates with the upper surface and lower surface of the plate 30 to form parallel conduits on opposite sides of the plate. A convoluted sheet material, such as thin aluminum, copper or the like, is disposed within the conduit formed by the surfaces of plate 30 and the shroud 34. The convoluted sheet material is preferably brazed, welded or otherwise attached to the plate 30 by any suitable means to provide thermal conduction between the plate and the sheet material. When placed within the conduit the sheet material forms a series of fins which form a plurality of parallel channels within the conduit. It will thus be observed that since the thin sheet material can be formed in closely spaced convolutions, each convolution of the sheet material forms a heat dissipating fin positioned within the air flow.

Referring now to FIG. 1 it will be observed that the height of shroud 34 above the surface of the plate 30 is preferably equal to the distance between the surface of plate 30 and the horizontal divider 21. Likewise, the shroud 34 projects below the lower surface of plate 30 approximately the same distance. Accordingly, when the module is positioned within the enclosure as illustrated in FIG. 1, the shroud occupies the full vertical space between two parallel divider plates 21. In the embodiment shown in FIG. 1 the rear of shroud 34, and hence the convoluted fin stock 35, terminates at the end of the upper divider plate 21. It will therefore be observed that when a plurality of such modules are installed in the enclosure shown in FIG. 1 the various electronic components 33 will be exposed at the open downstream end of the enclosure and displayed in a descending cascade arrangement. Accordingly, the electronic devices may be readily electrically interconnected as desired without removing the modules from the enclosures.

It will be readily observed that the lateral dimensions of the plates 30 may be formed as desired so that a plurality of individual cellular modules may be mounted on a single beam 20. Likewise, if desired, individual vertical partitions 36 may be positioned between any two or more of the parallel horizontal divider plates 21.

By attaching top plate 15 by means of hinge 17 it will be observed that the interior of the enclosure is easily accessible. Accordingly, each module may be removed or inserted individually by placing bolts 32 in the groove 31*a* in the module, positioning the module in the desired space at the open end of the enclosure, positioning the bolts through holes in the beam 20 and attaching the nuts to bolts from the interior of the enclosure. Since the head of bolt 32 is slideable within the channel 31 on the plate 30, various sizes of plates may be accommodated on any individual beam 20.

In the arrangement described it will also be observed that a high density of individual electronic components may be placed within a single enclosure, each receiving adequate cooling by forced convection by air forced through the high density of cooling fins 35. Since the electronic components are mounted individually or in groups on individual modules, the module may be rearranged without affecting air flow. Furthermore, modules without electronic devices may be used to occupy blank spaces in the gridwork. Alternatively blank modules which have the fin area blocked may be used in blank spaces to divert air flow through the other modules.

It should be observed that the components of the enclosure can be made of various dimensions so that the size of the enclosure may vary as desired. Likewise, the modules may be made of various widths so that the arrangement of electronic devices may also be varied as desired.

Although the invention has been described with particular reference to specific embodiments thereof it will be readily understood by those skilled in the art that various modifications and variations may be resorted to without departing from the spirit and scope of the invention as defined by the appended claims.

What is claimed:

1. Apparatus for mounting and cooling electronic devices comprising:

a. an enclosure substantially rectangular in a first plane, b. means for forcing air longitudinally through said enclosure along the axis normal to said first plane, c. support beams traversing the interior of said enclosure parallel to said first plane, d. a plurality of support modules each comprising:

i. a substantially rectangular plate member having substantially parallel upper and lower surfaces, ii. a lipped groove formed in one end surface of said plate member, iii. shroud means cooperating with said upper surface and said lower surface to form parallel conduits on opposite sides of said plate member, and vi. fins affixed to said upper and lower surfaces of said plate member within said conduits forming a plurality of parallel channels within said conduits, and e. means for removeably attaching said support modules to said support beams.

2. Apparatus as defined in claim 1 wherein said support beams are disposed in a substantially vertical plane.

3. Apparatus as defined in claim 1 wherein said support beams are disposed in a plane which substantially deviates from the vertical plane.

4. Apparatus as defined in claim 1 including divider plates disposed substantially parallel to the floor of said enclosure and substantially equidistant from adjacent support beams.

5. Apparatus as defined in claim 4 including vertically disposed divider plates extending between at least two adjacent horizontal divider plates.

6. Apparatus as defined in claim 4 wherein said shroud means extends vertically in both directions from said plate member substantially the entire distance separating divider plates disposed on opposite sides of the plate member.

7. Apparatus as defined in claim 1 wherein said fins comprise convoluted sheet material, each convolution extending substantially vertically between the surface of said plate member and said shroud means.

* * * * *